(12) United States Patent
Bernier et al.

(10) Patent No.: US 8,444,043 B1
(45) Date of Patent: May 21, 2013

(54) UNIFORM SOLDER REFLOW FIXTURE

(75) Inventors: William E. Bernier, Endwell, NY (US); Marcus E. Interrante, New Paltz, NY (US); Rajneesh Kumar, Poughkeepsie, NY (US); Chenzhou Lian, Poughquag, NY (US); Janak G. Patel, South Burlington, VT (US); Peter Slota, Jr., Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/362,228

(22) Filed: Jan. 31, 2012

(51) Int. Cl.
*B23K 31/00* (2006.01)
*B23K 31/02* (2006.01)

(52) U.S. Cl.
USPC ............. 228/180.22; 228/179.1; 228/233.2; 438/612

(58) Field of Classification Search
USPC ........ 228/121, 179.1, 180.22, 233.2; 438/613
See application file for complete search history.

(56) References Cited

U.S. PATENT DOCUMENTS

| | | | |
|---|---|---|---|
| 4,278,867 A | 7/1981 | Tan | |
| 4,813,589 A | 3/1989 | Palmer et al. | |
| 5,201,451 A | 4/1993 | Desai et al. | |
| 5,423,931 A | 6/1995 | Inoue et al. | |
| 5,461,774 A | 10/1995 | Holmes et al. | |
| 5,542,601 A | 8/1996 | Fallon et al. | |
| 5,598,965 A | 2/1997 | Scheu | |
| 6,013,541 A | 1/2000 | Tan et al. | |
| 6,145,734 A | 11/2000 | Taniguchi et al. | |
| 6,375,060 B1 | 4/2002 | Silhavy | |
| 6,402,011 B1 | 6/2002 | Taniguchi et al. | |
| 6,495,397 B2 * | 12/2002 | Kubota et al. | 438/108 |
| 6,509,529 B2 | 1/2003 | Kamath et al. | |
| 7,169,641 B2 | 1/2007 | Shim et al. | |
| 7,176,555 B1 | 2/2007 | Jao et al. | |
| 7,235,886 B1 | 6/2007 | Chandran et al. | |
| 7,642,136 B2 * | 1/2010 | Hooi | 438/118 |
| 2005/0279812 A1 * | 12/2005 | Tago et al. | 228/180.5 |

(Continued)

FOREIGN PATENT DOCUMENTS

| | | |
|---|---|---|
| EP | 0907962 A1 | 4/1999 |
| JP | 2001339152 A | 12/2001 |
| WO | 9749127 | 12/1997 |

OTHER PUBLICATIONS

U.S. Appl. No. 13/036,086, filed Feb. 28, 2011, entitled: "Flip Chip Assembly Method Employing Post-Contact Differential Heating" First Named Inventor: Rajneesh Kumar.

*Primary Examiner* — Nicholas P D'Aniello

(74) *Attorney, Agent, or Firm* — Scully, Scott, Murphy & Presser, P.C.; Matthew Zehrer

(57) ABSTRACT

An array of solder balls is attached to solder pads of one of a first substrate and a second substrate. After aligning the array of solder balls relative to solder pads of the other of the first substrate and the second substrate, a thermal-mass-increasing fixture is placed on a surface of the second substrate to form an assembly of the first substrate, the second substrate, and the array of the solder balls therebetween, and the thermal-mass-increasing fixture. The thermal-mass-increasing fixture is in physical contact with at least a surface of a periphery of the second substrate. The thermal-mass-increasing fixture reduces the cool-down rate of peripheral solder balls after a reflow step, thereby increasing time for deformation of peripheral solder balls during the cool-down and reducing the mechanical stress on the solder balls after the cool-down.

18 Claims, 24 Drawing Sheets

U.S. PATENT DOCUMENTS

| | | |
|---|---|---|
| 2006/0043602 A1 | 3/2006 | Chang et al. |
| 2008/0149370 A1 | 6/2008 | Lee et al. |
| 2009/0104735 A1* | 4/2009 | Ito et al. .................. 438/121 |
| 2009/0137084 A1 | 5/2009 | Kida |

* cited by examiner

UNIFORM SOLDER REFLOW FIXTURE

BACKGROUND

The present disclosure relates to substrate bonding, and particularly to a fixture for inducing uniform solder reflow and a method of bonding substrates employing the same.

A first substrate can be bonded to a second substrate by employing an array of solder balls. For example, in a solder bonding employing bonding pads, each solder ball contacts a bonding pad on the semiconductor chip and another bonding pad on another semiconductor chip or the packaging substrate. Each bonding pad is a contiguous metal pad, and can be formed out of the last metal layer of a metal interconnect structure during a semiconductor manufacturing sequence. Each bonding pad is large enough to accommodate the bottom portion of a solder ball. Typically, an array of solder balls can be employed to provide input/output (I/O) connections between the semiconductor chip and another semiconductor chip or a packaging substrate.

Connections employing an array of solder balls, such as C4 balls or any other type of solder balls, are susceptible to mechanical stress created by a mismatch in the coefficients of thermal expansion (CTE's) between the semiconductor chip and the other semiconductor chip or the packaging substrate. Such mechanical stress may cause cracks in the solder balls, back-end-of-lines in chips, or the semiconductor chip(s), causing the semiconductor chip(s) to fail during flip chip assembly process and/or usage.

The problem of mechanical stress caused by the mismatch between CTE's are exacerbated when an organic substrate is employed for a packaging substrate because the mismatch of CTE's is greater between organic substrates and semiconductor substrates than between ceramic substrates and semiconductor substrates. When an organic substrate is used as a packaging substrate for a fine pitch flip chip assembly, substrate warpage can occur in the conventional reflow process during which solder balls reflow. This warpage can result in non-wetting of solder bumps and/or bridging between solder bumps, thereby decreasing the assembly yield.

In general, organic substrates expand and contract more than silicon chips. For example, a silicon chip has a CTE of about 2.6 p.p.m./° C., and an organic substrate has a CTE of about 17 p.p.m./° C. Such a mismatch between CTE's can create thermally-induced stress and strain in a bonded flip-chip structure during the flip chip assembly process. Thermally-induced stress and strain in the flip-chip structure during a reflow process often results in a failure of back-end-of-line (BEOL) interconnect structures.

The thermally-induced stress caused by the mismatch between CTE's is greater on C4 balls located on a periphery of the flip-chip structure because the relative lateral displacement of two opposing C4 pads during a cool-down after a reflow increases with distance from the center of the flip-chip structure, and because the cooling rate of the C4 balls at the periphery is greater than the cooling rate of the C4 balls at the center of the flip-chip structure. Such mechanical stress causes C4 balls or other interconnect structures within the organic substrate or the silicon chip to crack, causing electrical failures.

BRIEF SUMMARY

An array of solder balls is attached to solder pads of one of a first substrate and a second substrate. After aligning the array of solder balls relative to solder pads of the other of the first substrate and the second substrate, a thermal-mass-increasing fixture is placed on a surface of the second substrate to form an assembly of the first substrate, the second substrate, and the array of solder balls therebetween, and the thermal-mass-increasing fixture. The thermal-mass-increasing fixture is in physical contact with at least a surface of a periphery of the second substrate. The thermal-mass-increasing fixture reduces the cool-down rate of peripheral solder balls after a reflow step, thereby increasing time for deformation of peripheral solder balls during the cool-down and reducing the mechanical stress on the solder balls after the cool-down.

According to an aspect of the present disclosure, a method of bonding substrates is provided. The method includes: bonding an array of solder balls to one of a first substrate and a second substrate; forming an assembly of the first substrate, the second substrate, the array of solder balls, and a thermal-mass-increasing fixture, wherein the thermal-mass-increasing fixture is in contact with at least a peripheral surface of the second substrate; placing the assembly in a furnace, wherein the first substrate and the array of solder balls are heated to a higher temperature than the second substrate and the thermal-mass-increasing fixture; and cooling the assembly while the thermal-mass-increasing fixture is in contact with the peripheral surface of the second substrate, wherein presence of the thermal-mass-increasing fixture in the assembly reduces a cool-down rate of a subset of the solder balls that is located at a periphery of the array.

DETAILED DESCRIPTION

Figure 1A:
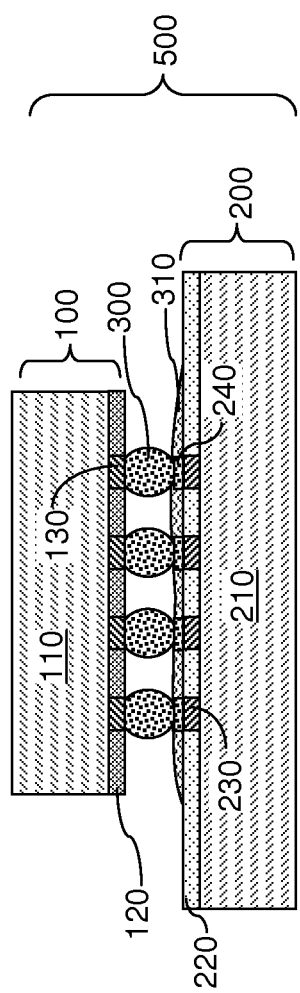
FIG. 1A is a schematic vertical cross-sectional view of a first exemplary structure after aligning a first substrate, a second substrate, and an array of solder balls according to a first embodiment of the present disclosure.

As stated above, the present disclosure relates to a fixture for inducing uniform solder reflow and a method of bonding substrates employing the same, which is now described in detail with accompanying figures. It is noted that like and corresponding elements are referred to by like reference numerals. The drawings are not in scale.

Referring to FIG. 1A, a first exemplary process according to a first embodiment of the present disclosure employs a first exemplary structure. The first exemplary structure includes a stack 500 of a first substrate 100, a second substrate 200, and an array of solder balls 300. The first substrate 100 can be a semiconductor chip, an interposer, or a packaging substrate.

The second substrate 200 can be a semiconductor chip, a semiconductor wafer, an interposer, a carrier, or a packaging substrate.

The first substrate 100 can include a first substrate layer 110, a first surface dielectric layer 120, and an array of first bonding pads 130 embedded within the first surface dielectric layer 120. Each bonding pad within the array of first bonding pads 130 can be electrically connected to at least one semiconductor device within the first substrate layer 110 through metal interconnect structures (not shown) embedded in the first substrate layer 110. The first substrate layer 110 includes semiconductor devices that can be, for example, field effect transistors, bipolar transistors, diodes, and/or optical semiconductor devices.

The second substrate 200 can be another semiconductor chip or a packaging substrate or an interposer. If the second substrate 200 is another semiconductor chip, the second substrate 200 includes semiconductor devices therein. If the second substrate 200 is a packaging substrate, the second substrate 200 includes layers of wiring structures (metal interconnect structures), and can be a ceramic substrate, an organic laminated substrate, a silicone substrate, a metal substrate, or a flexible film substrate.

The second substrate 200 includes a second substrate layer 210, a second surface dielectric layer 220, and an array of second bonding pads 230 embedded within the second surface dielectric layer 220. Each bonding pad within the array of second bonding pads 230 can be electrically connected to the layers of wiring within the second substrate 200.

In one embodiment, the first substrate 100 can be a semiconductor chip, and the second substrate 20 can be a packaging substrate. The packaging substrate can be any packaging substrate known in the art, and can be, but is not limited to, a ceramic substrate, an organic laminated substrate, a silicone substrate, a metal substrate, and a flexible film substrate.

The array of solder balls 300 is bonded to a first substrate 100 or the second substrate 200. In the illustrated exemplary structure, the array of solder balls 300 are attached to the array of first bonding pads 130 employing methods known in the art. The first substrate 100 can be held upside down so that the array of solder balls 300 contacts a top surface of the second substrate 200. The second substrate 200 is held upright so that an exposed surface of the second surface dielectric layer 220 is located at the topmost portion of the second substrate 200 and faces the bottommost surface of the first substrate 100. In one embodiment, the solder balls 300 can be lead-free and include tin and silver. In one embodiment, the solder balls 300 can be C4 balls.

The array of solder balls 300 and the second substrate 200 are aligned such that each solder ball 300 overlies a second bonding pad 230. Optionally, surface solder material portions 240 can be formed directly on top surfaces of the array of second bonding pads 230. Surface solder material portions 240 are additional solder material portions that can be employed to facilitate the solder bonding process by wetting underlying surfaces of metallic structures, which can be bonding pads, metal pillars, or any other type of metallic structure. Surface solder material portions 240 can include the same or different material as the material employed for solder balls 300. For example, the surface solder material portions 240 can have the same material as the material of an array of solder balls 300, which are subsequently used to bond the second substrate 200 to the first substrate 100. Optionally, a solder flux 310 can be applied on the top surface of the second substrate 200 that includes the second bonding pads 230, i.e., over the surfaces of the second bonding pads 230 and the second surface dielectric layer 220, prior to bringing the array of solder balls 300 into contact with the second bonding pads 230 or the surface solder material portions 240 (if employed).

While the present disclosure employs an exemplary structure in which the array of solder balls 300 is bonded to the first substrate 100 and is subsequently aligned to the second substrate 200, embodiments in which the array of solder balls is bonded to the second substrate 200 and is subsequently aligned to the first substrate 100 can also be employed.

Figure 1B:
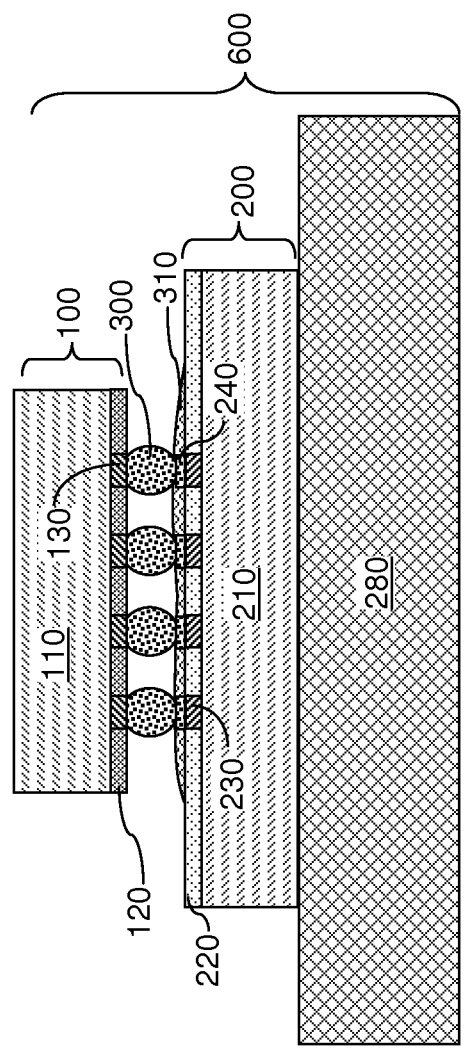
FIG. 1B is a schematic vertical cross-sectional view of the first exemplary structure after forming an assembly of the first substrate, the second substrate, the array of solder balls, and a thermal-mass-increasing fixture according to the first embodiment of the present disclosure.
Figure 1C:
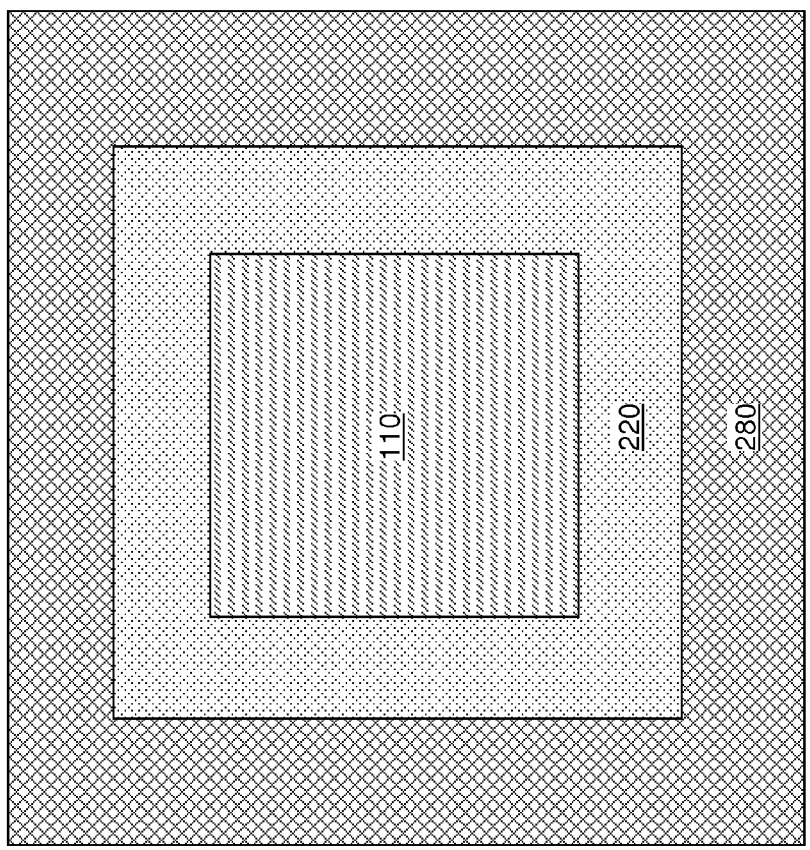
FIG. 1C is a top-down view of the first exemplary structure of FIG. 1A.

Referring to FIGS. 1B and 1C, a thermal-mass-increasing fixture 280 is added to the stack of the first substrate 100, the second substrate 200, and the array of solder balls 300. An assembly 600 of the first substrate 100, the second substrate 200, the array of solder balls 300, and the thermal-mass-increasing fixture 280 is formed. The thermal-mass-increasing fixture 280 increases the thermal mass of the assembly 600 by adding to the thermal mass of the stack of the first substrate 100, the second substrate 200, and the array of solder balls 300.

Specifically, the second substrate 200 has a top surface and a bottom surface such that the top surface is more proximal to the first substrate 100 than the bottom surface. The thermal-mass-increasing fixture 280 is in contact with the bottom surface of the second substrate 200. In one embodiment, the entire back surface of the second substrate 200 can be in contact with a surface of the thermal-mass-increasing fixture 280.

In one embodiment, the thermal-mass-increasing fixture 280 has a specific heat capacity that is greater than a specific heat capacity of the second substrate 200. For example, the second substrate 200 can be a packaging substrate, and the thermal-mass-increasing fixture 280 can includes a material having a specific heat capacity that is greater than the specific heat capacity of the material of the packaging substrate. For example, the material of the thermal-mass-increasing fixture can be selected from, but is not limited to, a ceramic material, an elemental metal, an alloy of at least two metals, asphalt, gypsum, mica, and concrete.

In one embodiment, the thermal-mass-increasing fixture 280 has a heat capacity that is greater than the heat capacity of the second substrate 200. In another embodiment, the thermal-mass-increasing fixture 280 can have a heat capacity that is at least twice the heat capacity of the second substrate 200.

Figure 1D:
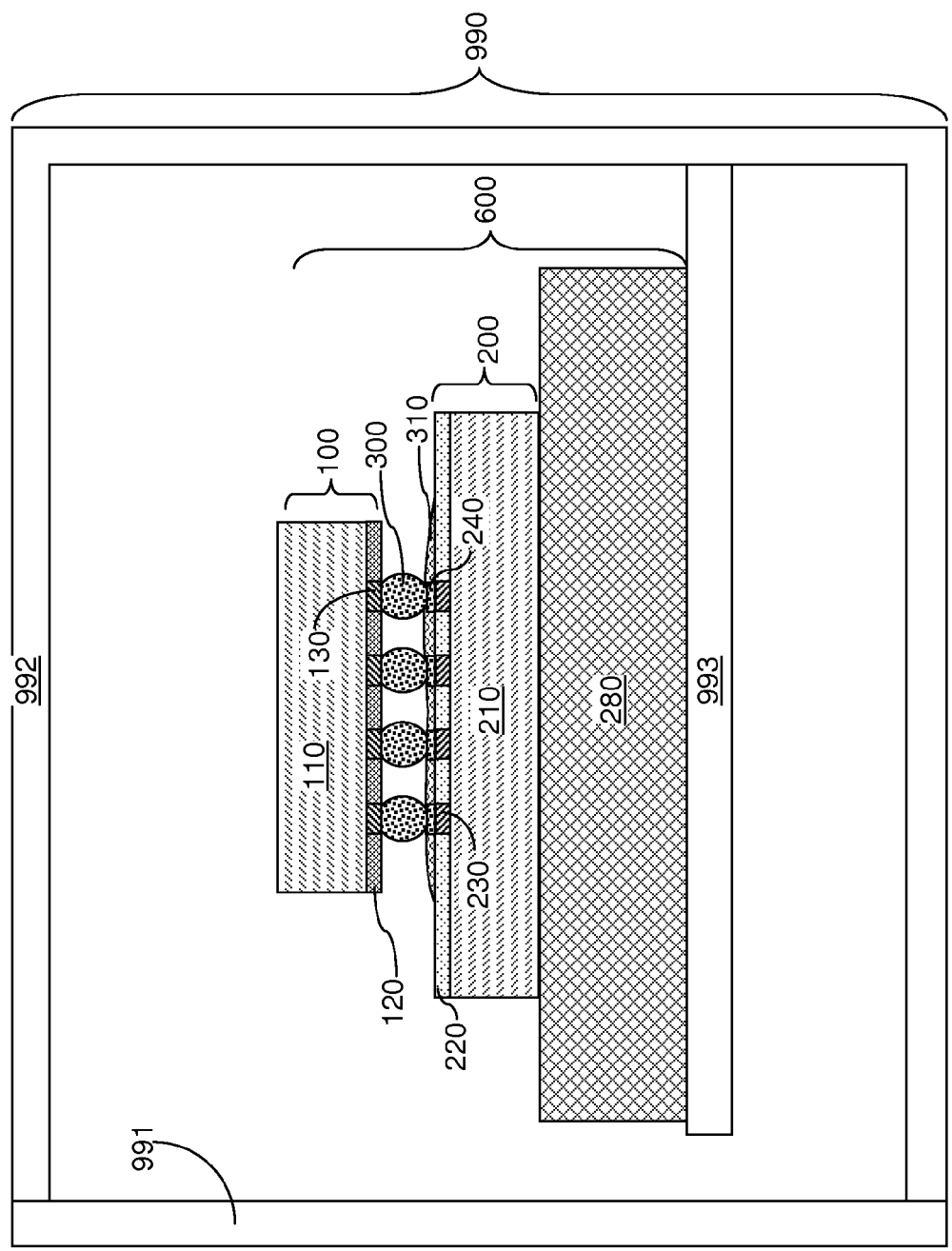
FIG. 1D is a vertical cross-sectional view of the first exemplary structure after the assembly is loaded into a furnace according to the first embodiment of the present disclosure.

Referring to FIG. 1D, the assembly 600 is loaded into a furnace 990. The furnace 990 can include a furnace enclosure 992, a loading door 991, and a shelf 993. The assembly 600 can be placed on the shelf 993 of the furnace 990.

The furnace 990 is provided with a heater element (not shown), which can be placed inside or outside of the enclosure 992. The enclosure can be opaque or transparent depending on the location of the heater element. For example, the heater element can located within an opaque furnace enclosure 992, or can be located outside a transparent furnace enclosure 992.

The heater element is configured to control the temperature within the furnace 990 at least up to the melting temperature of the solder balls 300. Upon placing of the assembly 600 in the furnace 990, the assembly 600 including the first substrate 100, the second substrate 200, the array of solder balls 300, and the thermal-mass-increasing fixture 280 are heated above room temperature.

The first substrate 100 and the array of solder balls 300 are heated to a higher temperature than the second substrate 200 and the thermal-mass-increasing fixture 280. The non-uniform heating of the assembly 600 can be effected, for example, by providing a heater element nearer to the first substrate 100 than to the second substrate 200, by directing heat from the side closer to the first substrate 100 than to the second substrate 200, or by any other means that provides a temperature gradient within the furnace 990.

Figure 1E:
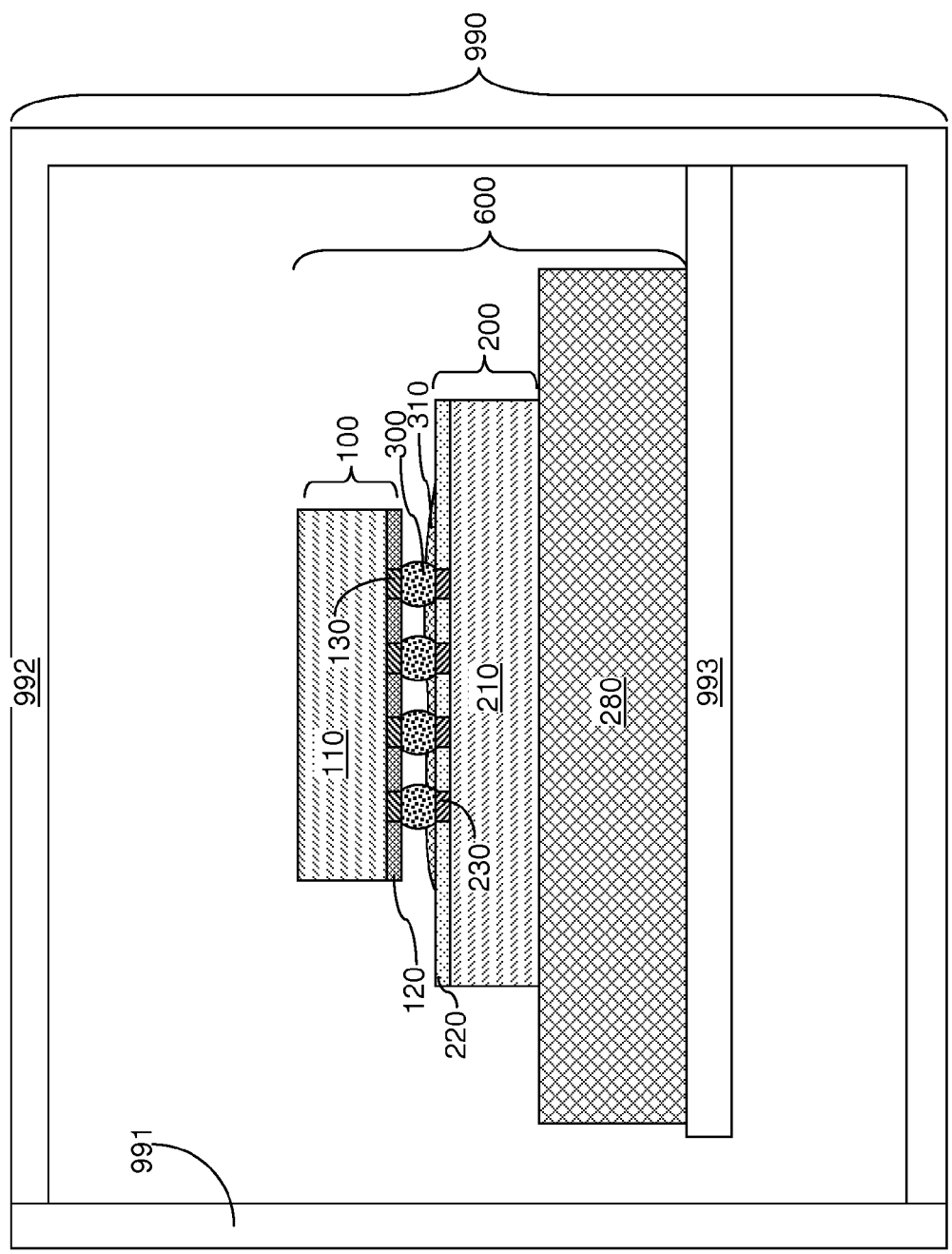
FIG. 1E is a vertical cross-sectional view of the first exemplary structure after reflow of the array of solder balls according to the first embodiment of the present disclosure.

Referring to FIG. 1E, the first substrate 100 and the array of solder balls 300 are heated above the melting temperature of the solder balls 300 in the furnace 900. The array of solder balls 300 reflows within the furnace 990, thereby bonding the second substrate 200 to the first substrate 100 through the array of solder balls 300, which are now bonded to the first substrate 100 and the second substrate 200. The process in which the array of solder balls 300 reflows and bonds to the first and second substrates (100, 200) is herein referred to as a reflow process.

During the reflow process, the second substrate 200 and the thermal-mass-increasing fixture 280 in the furnace 990 are maintained below the melting temperature of the material of the array of solder balls 300.

In one embodiment, the temperature of the array of solder balls 300 can be greater than the temperature of the second substrate 200 by at least 20 degrees Celsius throughout the reflow process.

In one embodiment, the temperature of the array of solder balls 300 can be greater than the temperature of the second substrate 200 by at least 50 degrees Celsius during the reflow process.

In one embodiment, the temperature differential between the top surface of the first substrate 100 and the array of solder balls 300 can be less than the temperature differential between the array of solder balls 300 and the second substrate 200 during the reflow process.

After the reflow process, the assembly 600 is cooled while the thermal-mass-increasing fixture 280 remains in contact with the entire back surface of the second substrate 200, which includes a peripheral portion of the back surface of the second substrate 200. The presence of the thermal-mass-increasing fixture 280 in the assembly 600 reduces a cool-down rate of a subset of the solder balls 300 that is located at a periphery of the array of the solder balls 300 relative to a cool-down rate of a comparative structure that includes only the first substrate 100, the second substrate 200, and the array of solder balls 300 and does not include a thermal-mass-increasing fixture.

Figure 1F:
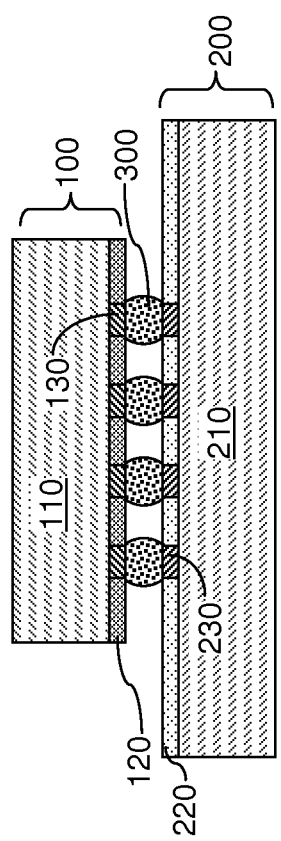
FIG. 1F is a vertical cross-sectional view of the first exemplary structure after cooling of the assembly and removal of a bonded structure from the furnace according to the first embodiment of the present disclosure.

Referring to FIG. 1F, a bonded structure including the first substrate 100, the second substrate 200, and the array of solder balls 300 is separated from the thermal-mass-increasing fixture 280 after cooling of the assembly 600, and is removed from the furnace 990. The separation of the bonded structure (100, 200, 300) from the thermal-mass-increasing fixture 280 can be performed prior to, or after, the removal of the bonded structure (100, 200, 300) from the furnace 990.

Figure 2:
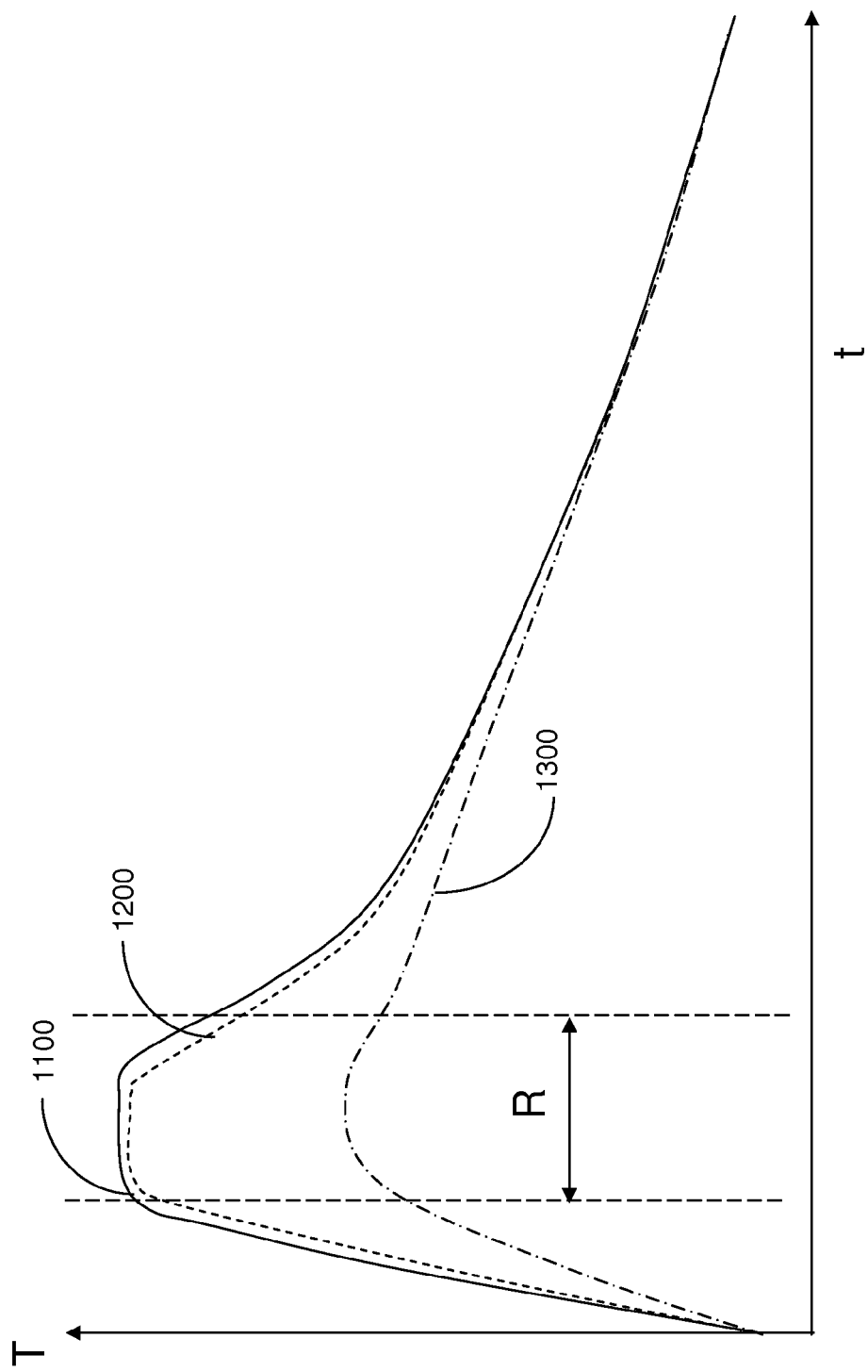
FIG. 2 is a schematic graph of temperatures at various portions of an assembly as a function of time according to an embodiment of the present disclosure.

Referring to FIG. 2, a schematic graph illustrates temperatures at various portions of the assembly 600 as a function of time. Curve 1100 illustrates the temperature at the top surface of the first substrate 100 as a function of time. Curve 1200 illustrates the temperature at peripheral solder balls 130 as a function of time. Curve 1300 illustrates the temperature at the top of the second substrate 200 as a function of time. The time period R represents the duration of the reflow process, i.e., the time duration during which the peripheral solder balls 130 are above the melting temperature of the material of the solder balls 130. The presence of the thermal-mass-increasing fixture 280 in thermal contact with the second substrate 200 retards the increase of temperature for the second substrate 200 and the thermal-mass-increasing fixture 280 relative to the first substrate 100 and the array of solder balls 300 for a sufficient time duration such that the second substrate 200 is maintained below the melting temperature of the material of the array of solder balls 300 throughout the reflow process.

Figure 3A:
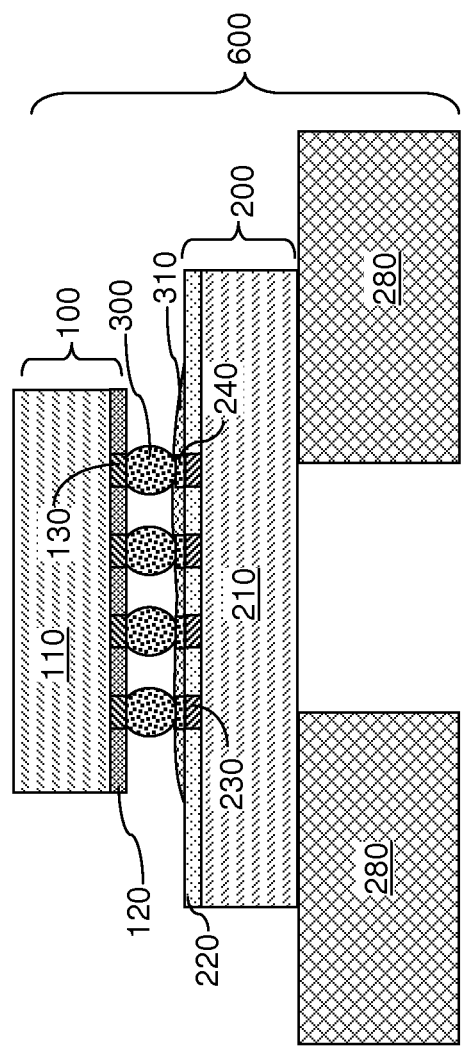
FIG. 3A is a vertical cross-sectional view of a second exemplary structure after forming an assembly of a first substrate, a second substrate, an array of solder balls, and a thermal-mass-increasing fixture according to a second embodiment of the present disclosure.
Figure 3B:
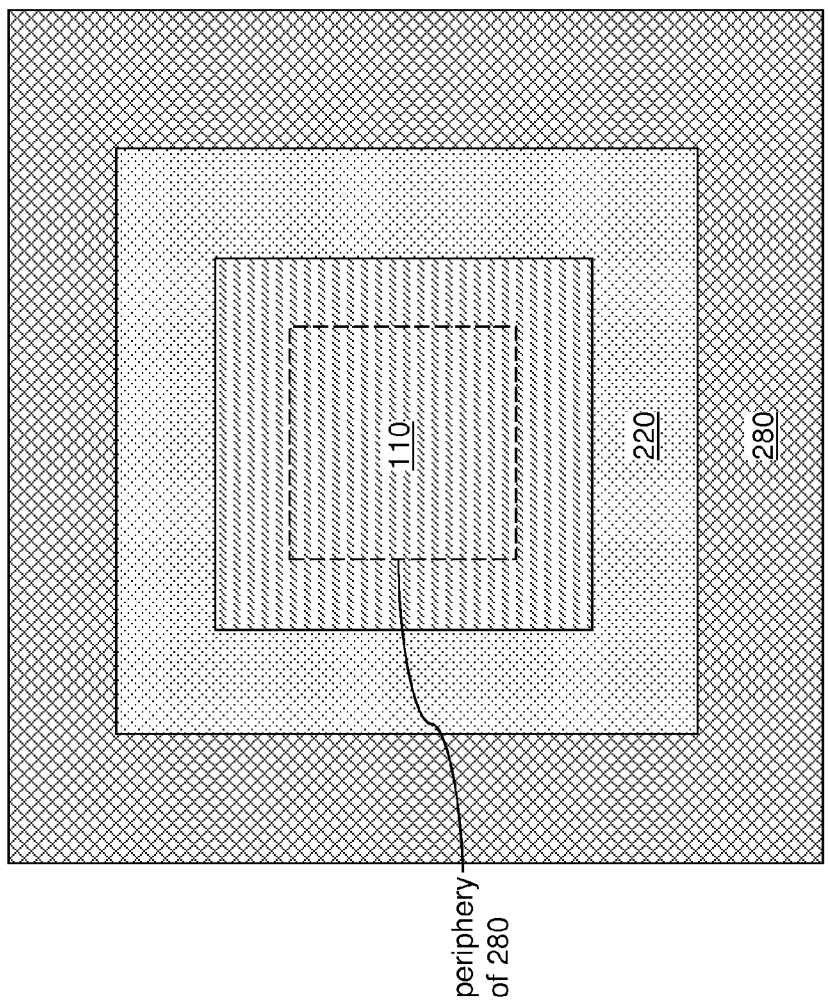
FIG. 3B is a top-down view of the second exemplary structure of FIG. 3A.

Referring to FIGS. 3A and 3B, a second exemplary process according to a second embodiment of the present disclosure employs the same processing steps as the first embodiment and a second exemplary structure, which is derived from the first exemplary structure by modifying the geometry of the thermal-mass-increasing fixture 280. The inner periphery of the thermal-mass-increasing fixture that would be seen in a see-through top-down view is shown in a dotted line in FIG. 3B. Specifically, the thermal-mass-increasing fixture 280 contacts a peripheral bottom surface of the second substrate 200, and does not contact a center portion of the bottom surface of the second substrate 200. For example, the thermal-mass-increasing fixture 280 can have a hole at a center portion thereof.

In the second embodiment, the lack of thermal contact between the center portion of the back surface of the second substrate 200 and the thermal-mass-increasing fixture 280 can be advantageously employed to increase the cool-down rate of a subset of solder balls 300 at a center portion of the array of solder balls 300 while retarding the cool-down of another subset of solder balls 300 at a peripheral portion of the array of solder balls 300, thereby providing a more uniform cool-down rate for the solder balls 300 within the array of solder balls 300 during the cool-down period after the reflow process.

Figure 4A:
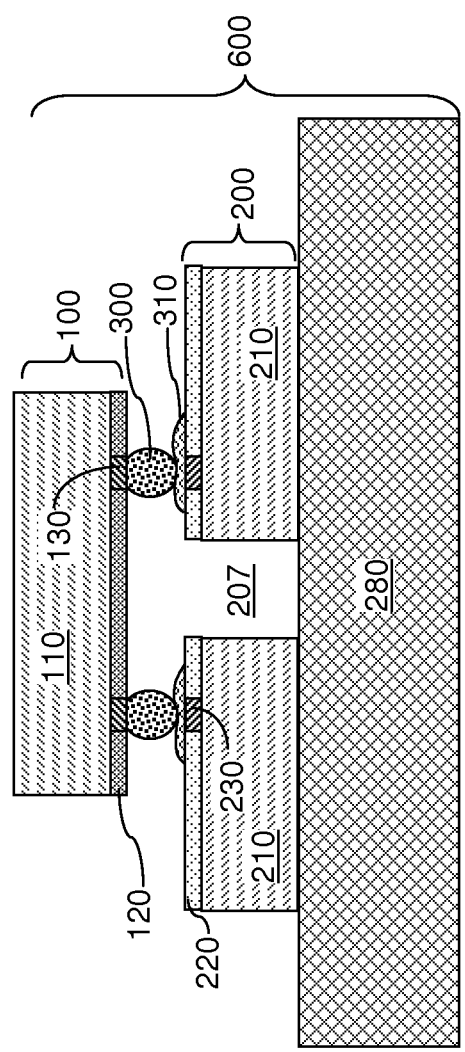
FIG. 4A is a vertical cross-sectional view of a third exemplary structure after forming an assembly of a first substrate, a second substrate, an array of solder balls, and a thermal-mass-increasing fixture according to a third embodiment of the present disclosure.
Figure 4B:
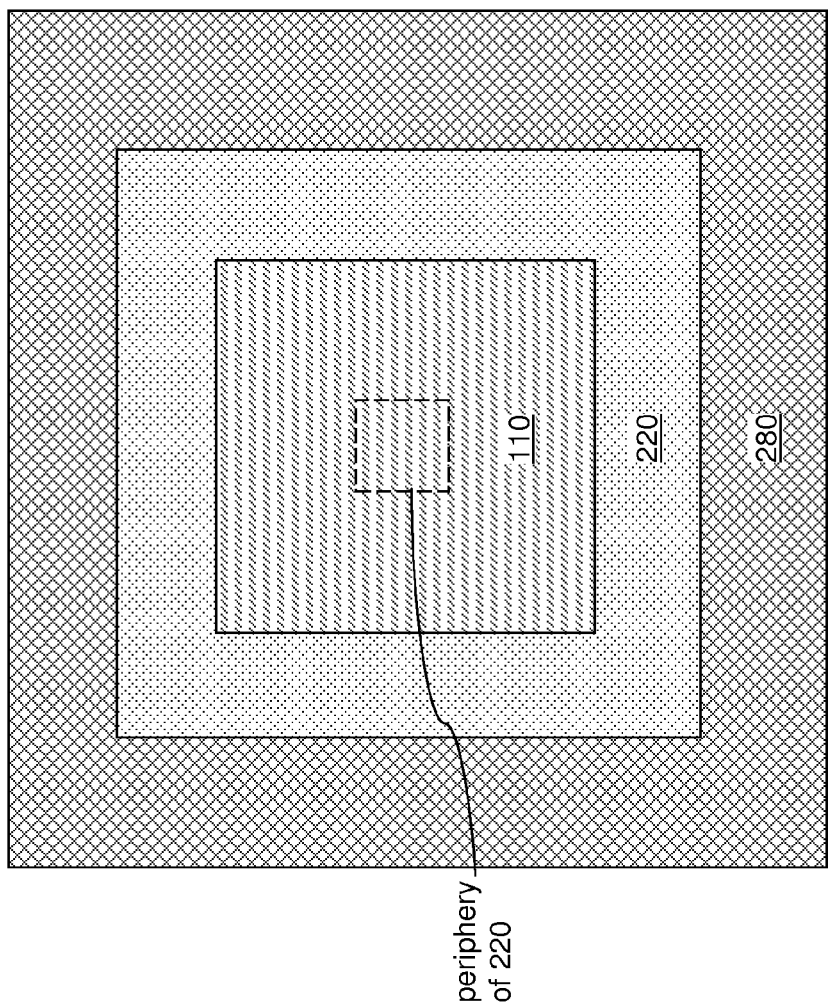
FIG. 4B is a top-down view of the third exemplary structure of FIG. 4A.

Referring to FIGS. 4A and 4B, a third exemplary process according to a third embodiment of the present disclosure employs the same processing steps as the first or second embodiments and a third exemplary structure, which is derived from the first or second exemplary structure by modifying the geometry of the second substrate 200. Specifically, a second substrate 200 having a hole at the center thereof is employed in the third embodiment. For example, the first substrate 100 can include thermally susceptible elements such as capacitors having a node dielectric that degrades at elevated temperatures. In such cases, the second substrate 200 can include a center cavity to reduce exposure of the thermally susceptible elements to elevated temperatures.

Figure 5:
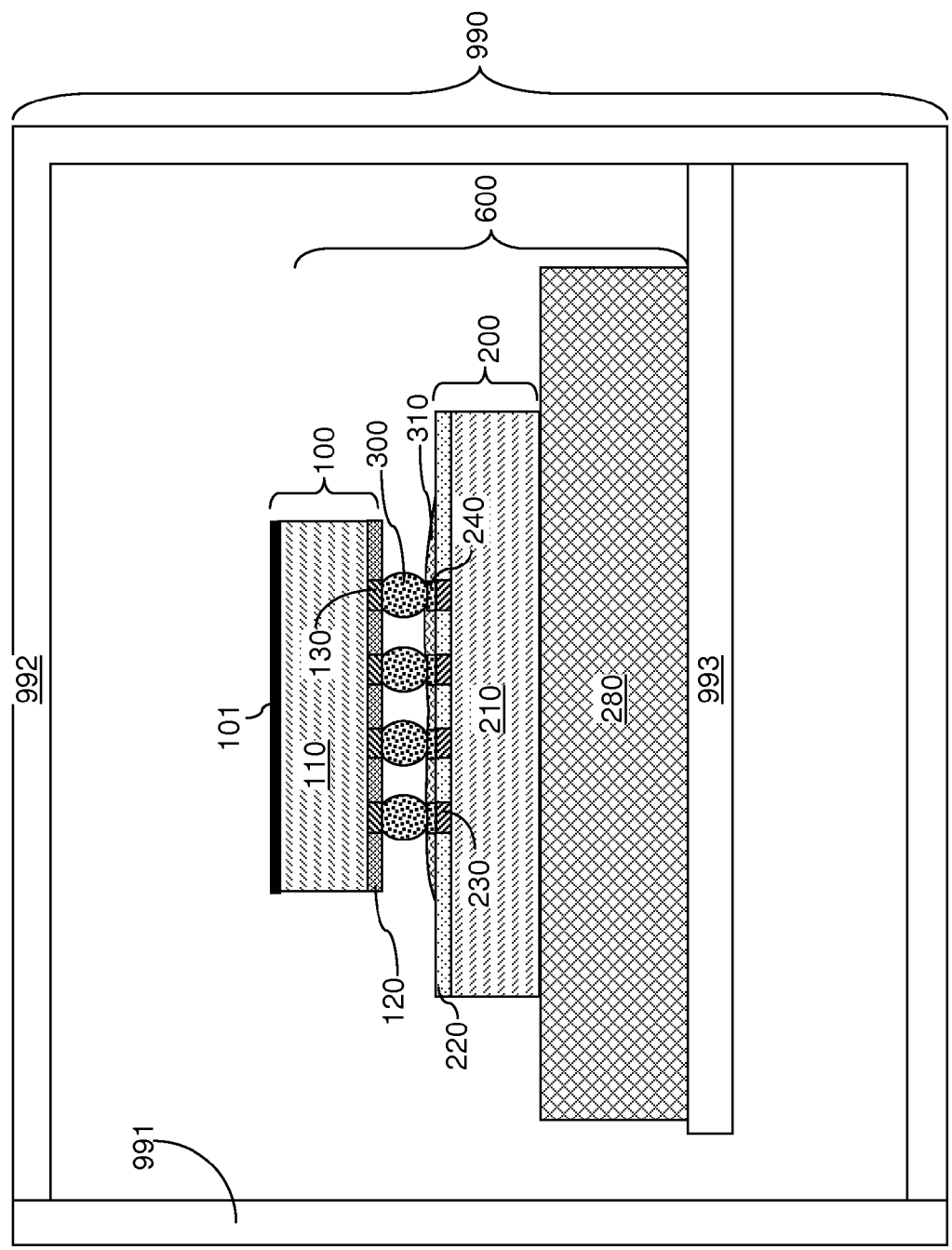
FIG. 5 is a vertical cross-sectional view of a fourth exemplary structure after loading of an assembly of a first substrate, a second substrate, an array of solder balls, and a thermal-mass-increasing fixture into a furnace according to a fourth embodiment of the present disclosure.

Referring to FIG. 5, a fourth exemplary process according to a fourth embodiment of the present disclosure employs the same processing steps as the first, second, or third embodiments and a fourth exemplary structure, which is derived from the first, second, or third exemplary structure by coating a top surface of the first substrate 100 with a material having a greater coefficient of absorption than the uncoated top surface of the first substrate 100 prior to placing the assembly in the furnace 900. An absorption enhancing layer 101 formed on the top surface of the first substrate 100 causes the temperature of the first substrate 100 and the array of solder balls 300 to rise more rapidly, and to maintain a greater temperature differential between the first substrate 100 and the second substrate 200 during the reflow process.

Figure 6A:
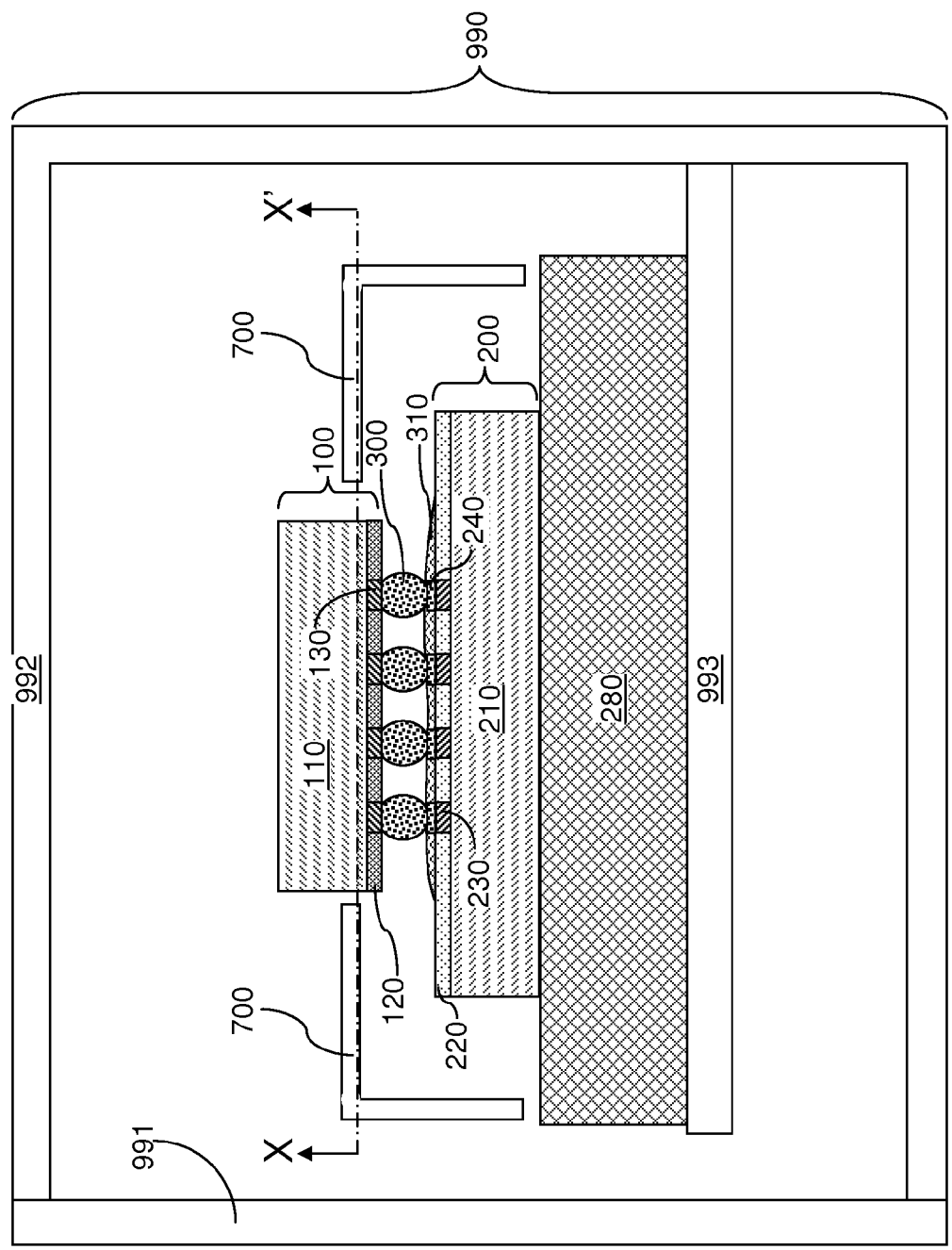
FIG. 6A is a vertical cross-sectional view of a fifth exemplary structure after loading of an assembly of a first substrate, a second substrate, an array of solder balls, and a thermal-mass-increasing fixture into a furnace according to a fifth embodiment of the present disclosure.
Figure 6B:
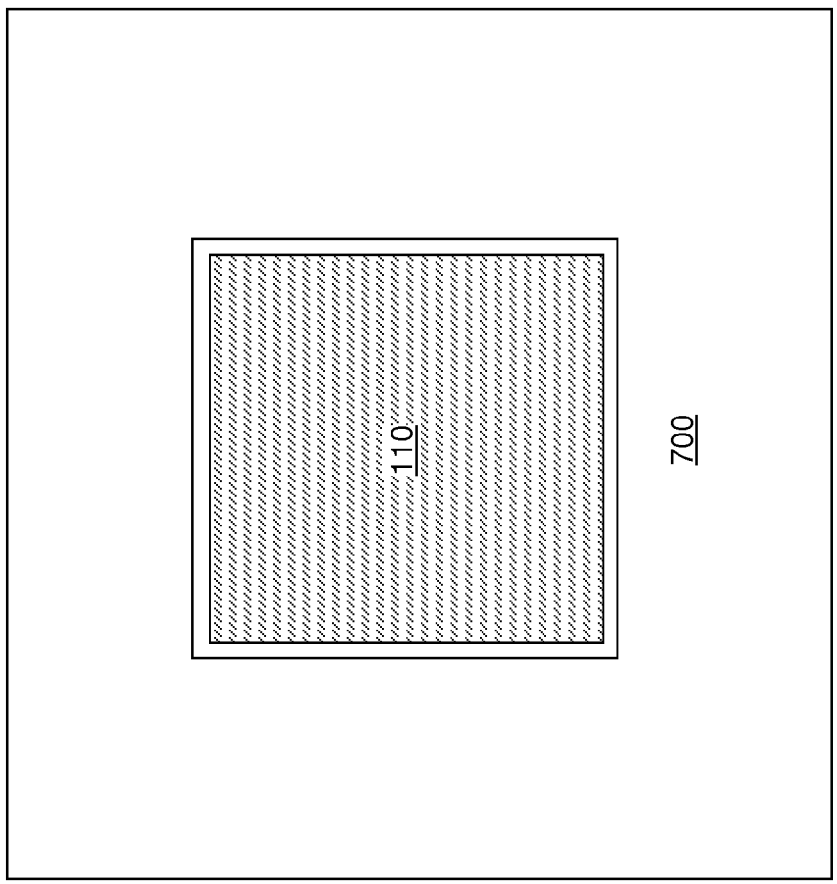
FIG. 6B is a horizontal cross-sectional view of the fifth exemplary structure along a horizontal plane X-X' in FIG. 6A.

Referring to FIGS. 6A and 6B, a fifth exemplary process according to a fifth embodiment of the present disclosure employs the same processing steps as the first, second, third, or fourth embodiments and a fifth exemplary structure, which is derived from the first, second, third, or fourth exemplary structure by providing a heat shield 700, which retards heating of the second substrate 200 and the thermal-mass-increasing fixture 280 during temperature ramp-up of the assembly 600, and retards cooling of the second substrate 200 and the thermal-mass-increasing fixture 280 during cool-down of the assembly 600. Thus, the heat shield 700 located above a periphery of the second substrate 200 and laterally surrounding the firsts substrate 100 causes the temperature of the first substrate 100 and the array of solder balls 300 to rise more rapidly, and to maintain a greater temperature differential between the first substrate 100 and the second substrate 200 during the reflow process. Further, the heat shield is present around the periphery of the second substrate 200 during the cooling of the assembly 600, thereby retarding the cool-down of peripheral solder balls 300 and reducing the temperature gradient within the array of solder balls 300 during the cool-down of the assembly 600.

Figure 7A:
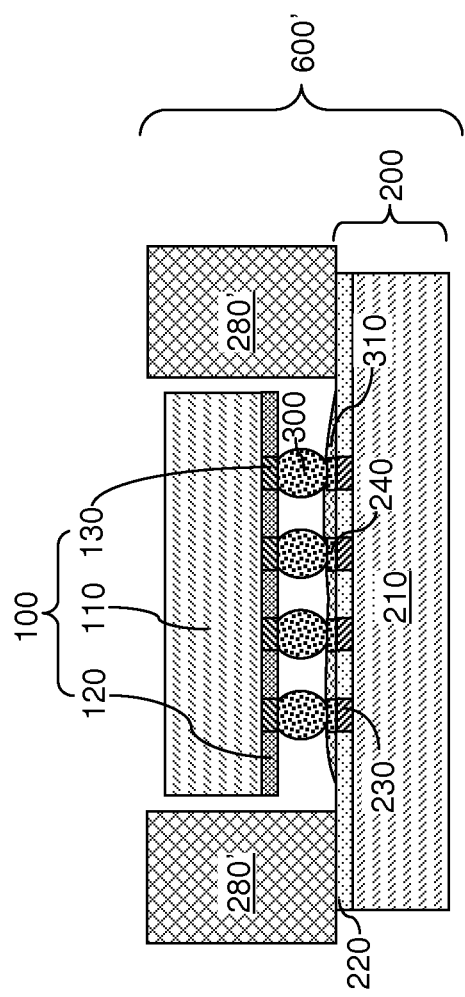
FIG. 7A is a vertical cross-sectional view of a sixth exemplary structure after forming an assembly of a first substrate, a second substrate, an array of solder balls, and a thermal-mass-increasing fixture according to a sixth embodiment of the present disclosure.
Figure 7B:
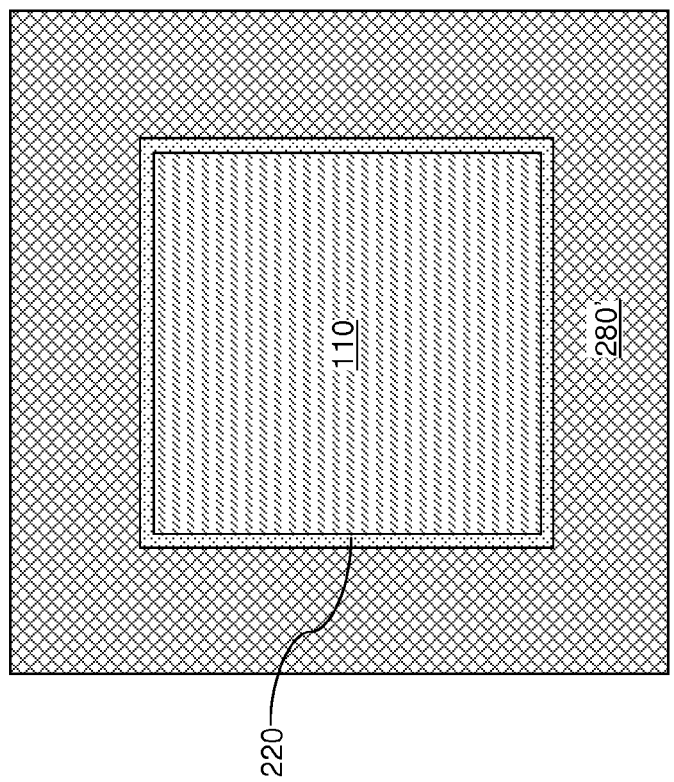
FIG. 7B is a top-down view of the sixth exemplary structure of FIG. 7A.

Referring to FIGS. 7A and 7B, a sixth exemplary process according to a sixth embodiment of the present disclosure employs the same processing steps as the first, second, third, fourth, or fifth embodiment and a sixth exemplary structure, which is derived from the exemplary structure by substituting a thermal-mass-increasing fixture 280' for the thermal-mass-increasing fixture 280 of the first embodiment. The second substrate 200 has a top surface and a bottom surface. The top surface of the second substrate 200 is more proximal to the first substrate 100 than the bottom surface of the second substrate 200. The thermal-mass-increasing fixture 280' is in contact with a peripheral portion of the top surface of the second substrate 200.

Specifically, the thermal-mass-increasing fixture 280' laterally surrounds the first substrate 100. The thermal-mass-increasing fixture 280' can have a hole having an area that is greater than an area of the first substrate 100.

In one embodiment, the thermal-mass-increasing fixture 280' has a specific heat capacity that is greater than a specific heat capacity of the second substrate 200. For example, the second substrate 200 can be a packaging substrate, and the thermal-mass-increasing fixture 280' can includes a material having a specific heat capacity that is greater than the specific heat capacity of the material of the packaging substrate. For example, the material of the thermal-mass-increasing fixture can be selected from, but is not limited to, a ceramic material, an elemental metal, an alloy of at least two metals, asphalt, gypsum, mica, and concrete.

In one embodiment, the thermal-mass-increasing fixture 280' has a heat capacity that is greater than the heat capacity of the second substrate 200. In another embodiment, the thermal-mass-increasing fixture 280' can have a heat capacity that is at least twice the heat capacity of the second substrate 200.

Figure 7C:
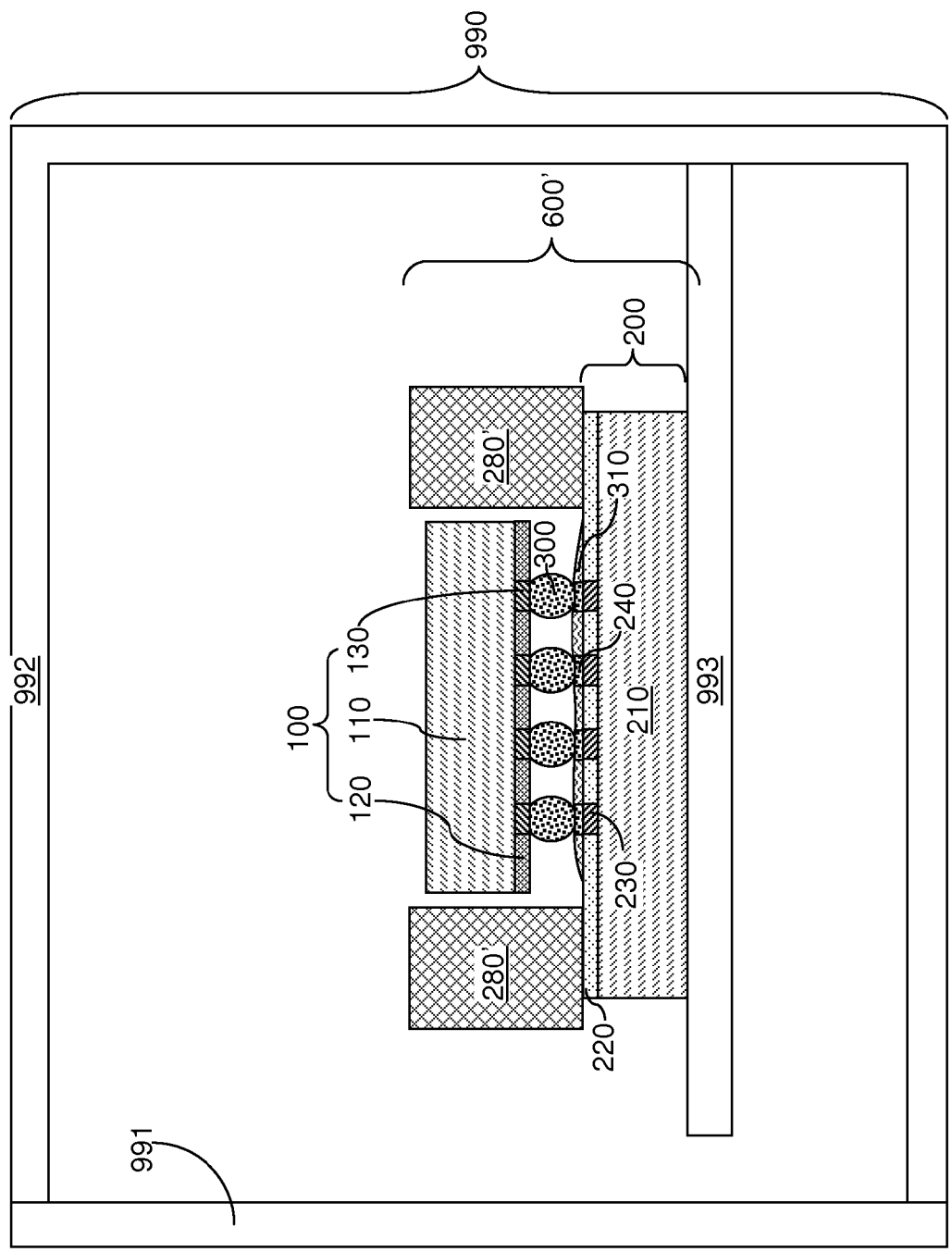
FIG. 7C is a vertical cross-sectional view of the sixth exemplary structure after the assembly is loaded into a furnace according to the sixth embodiment of the present disclosure.

Referring to FIG. 7C, the assembly 600' is loaded into a furnace 990, which can be the same as in the first, second, third, fourth, or fifth embodiment. The first substrate 100 and the array of solder balls 300 are heated to a higher temperature than the second substrate 200 and the thermal-mass-increasing fixture 280'. The non-uniform heating of the assembly 600' can be effected, for example, by providing a heater element nearer to the first substrate 100 than to the second substrate 200, by directing heat from the side closer to the first substrate 100 than to the second substrate 200, or by any other means that provides a temperature gradient within the furnace 990.

Figure 7D:
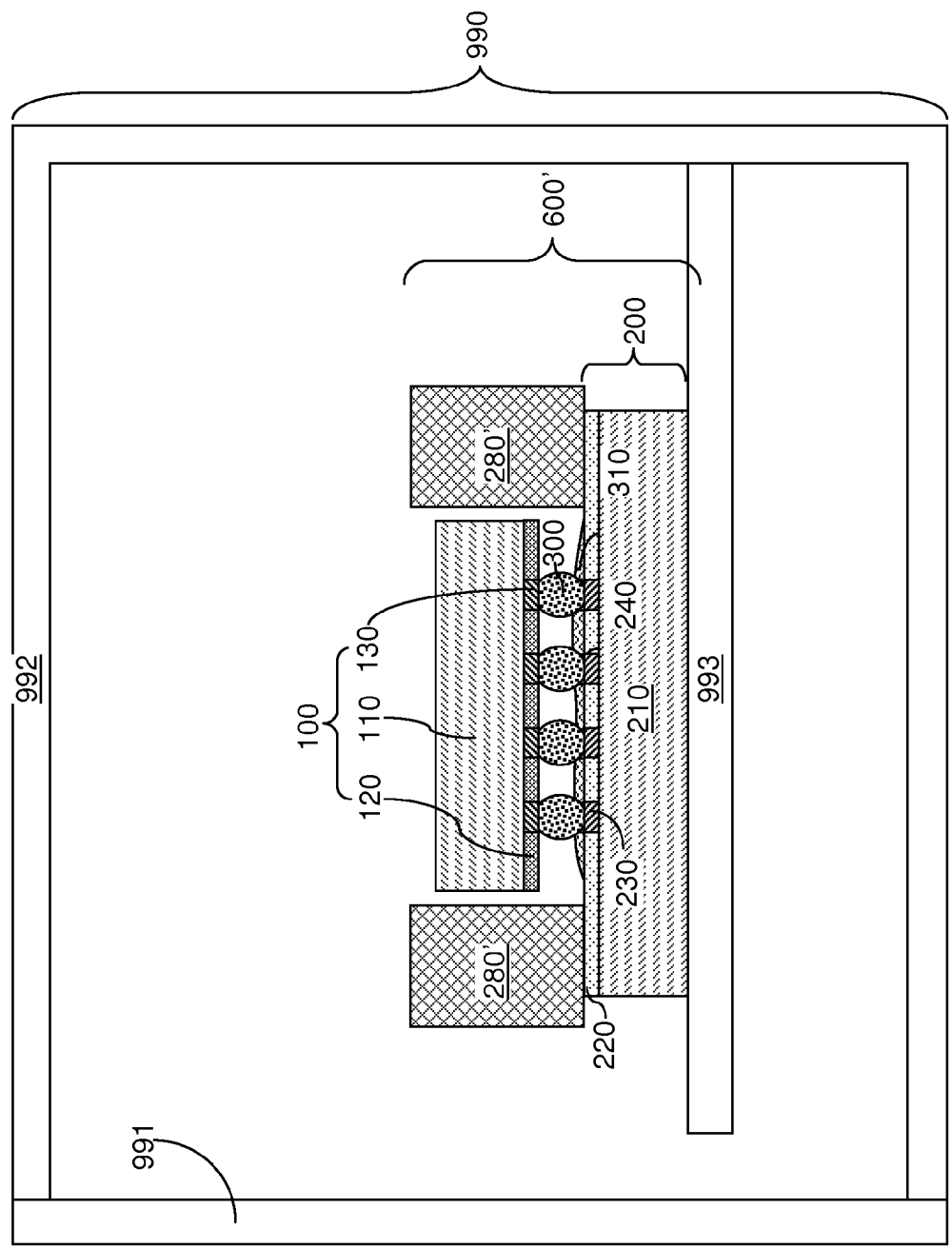
FIG. 7D is a vertical cross-sectional view of the sixth exemplary structure after reflow of the array of solder balls according to the sixth embodiment of the present disclosure.

Referring to FIG. 7D, a reflow process is performed during a time period corresponding to the time period R in FIG. 2. During the reflow process, the second substrate 200 and the thermal-mass-increasing fixture 280 in the furnace 990 are maintained below the melting temperature of the material of the array of solder balls 300.

In one embodiment, the temperature of the array of solder balls 300 can be greater than the temperature of the second substrate 200 by at least 20 degrees Celsius throughout the reflow process.

In one embodiment, the temperature of the array of solder balls 300 can be greater than the temperature of the second substrate 200 by at least 50 degrees Celsius during the reflow process.

In one embodiment, the temperature differential between the top surface of the first substrate 100 and the array of solder balls 300 can be less than the temperature differential between the array of solder balls 300 and the second substrate 200 during the reflow process.

After the reflow process, the assembly 600' is cooled while the thermal-mass-increasing fixture 280' remains in contact with the entire back surface of the second substrate 200, which includes a peripheral portion of the back surface of the second substrate 200. The presence of the thermal-mass-increasing fixture 280' in the assembly 600' reduces a cool-down rate of a subset of the solder balls 300 that is located at a periphery of the array of the solder balls 300 relative to a cool-down rate of a hypothetical comparative structure that includes only the first substrate 100, the second substrate 200, and the array of solder balls 300 and does not include a thermal-mass-increasing fixture.

A bonded structure including the first substrate 100, the second substrate 200, and the array of solder balls 300 is separated from the thermal-mass-increasing fixture 280' after cooling of the assembly 600', and is removed from the furnace 990. The separation of the bonded structure (100, 200, 300) from the thermal-mass-increasing fixture 280' can be performed prior to, or after, the removal of the bonded structure (100, 200, 300) from the furnace 990.

Figure 8A:
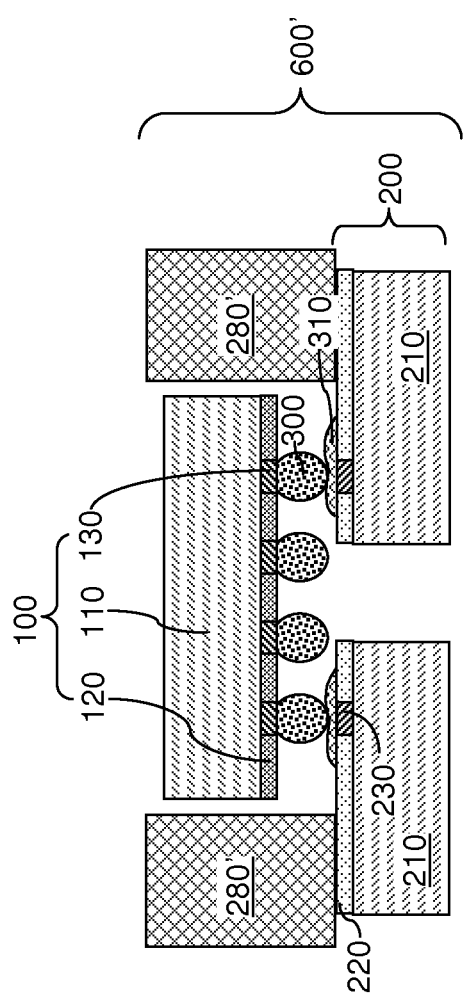
FIG. 8A is a vertical cross-sectional view of a seventh exemplary structure after forming an assembly of a first substrate, a second substrate, an array of solder balls, and a thermal-mass-increasing fixture according to a seventh embodiment of the present disclosure.
Figure 8B:
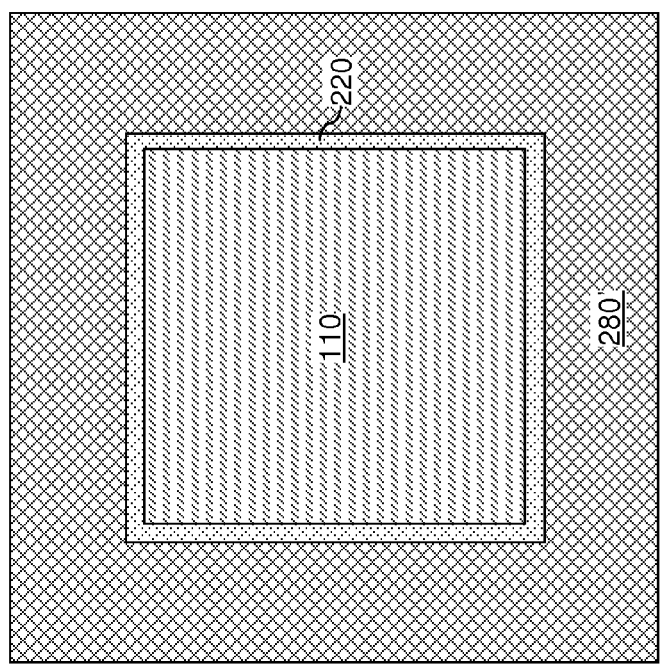
FIG. 8B is a top-down view of the seventh exemplary structure of FIG. 8A.

Referring to FIGS. 8A and 8B, a seventh exemplary process according to a seventh embodiment of the present disclosure employs the same processing steps as the first, second, third, fourth, fifth, or sixth embodiments and a seventh exemplary structure, which is derived from the sixth exemplary structure by modifying the geometry of the second substrate 200. Specifically, a second substrate 200 having a hole at the center thereof is employed in the seventh embodiment. For example, the first substrate 100 can include thermally susceptible elements such as capacitors having a node dielectric that degrades at elevated temperatures. In such cases, the second substrate 200 can include a center cavity to reduce exposure of the thermally susceptible elements to elevated temperatures.

Figure 9:
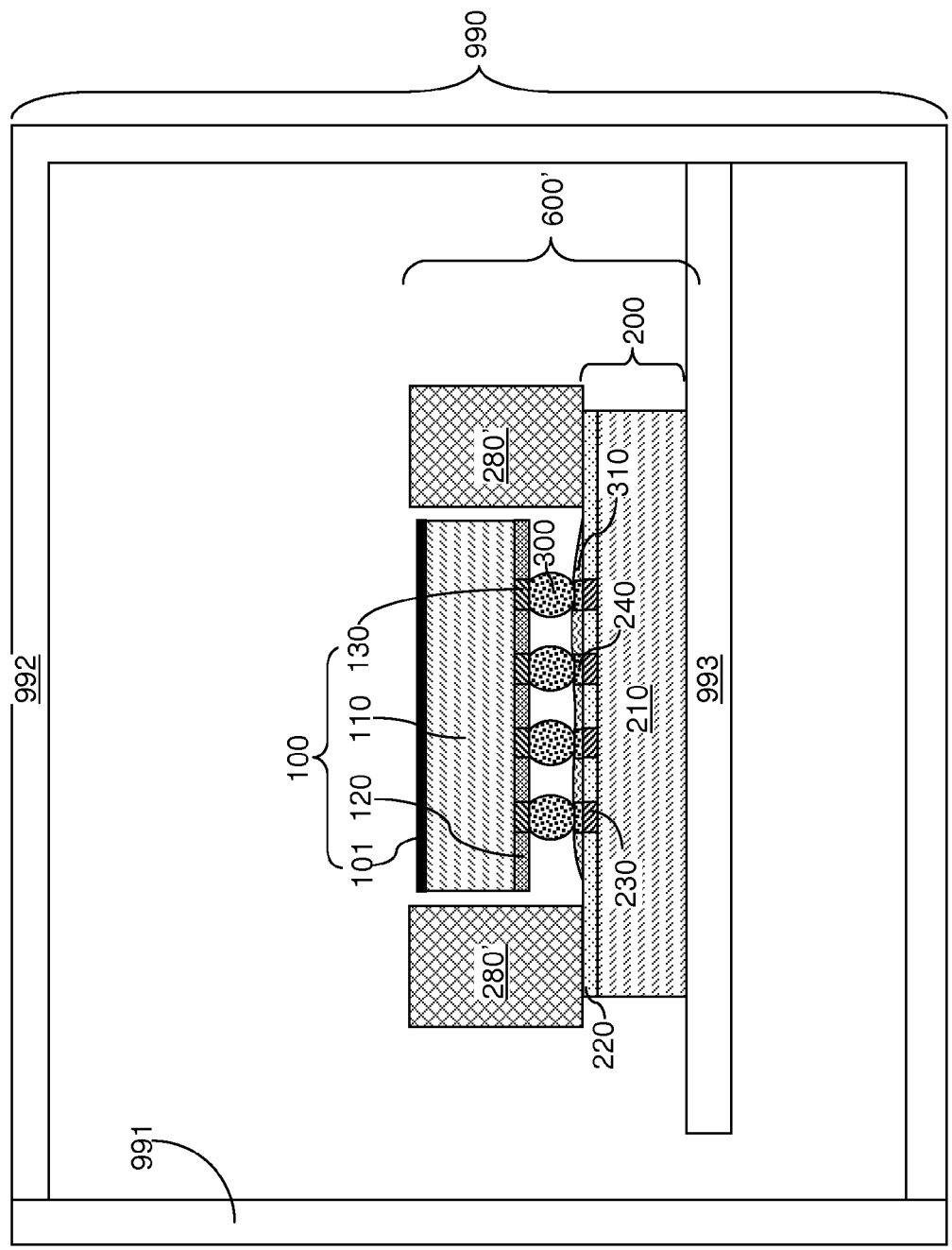
FIG. 9 is a vertical cross-sectional view of an eighth exemplary structure after loading of an assembly of a first substrate, a second substrate, an array of solder balls, and a thermal-mass-increasing fixture into a furnace according to an eighth embodiment of the present disclosure.

Referring to FIG. 9, an eighth exemplary process according to an eighth embodiment of the present disclosure employs the same processing steps as the first, second, third, fourth, fifth, sixth, or seventh embodiments and an eighth exemplary structure, which is derived from the sixth or seventh exemplary structure by coating a top surface of the first substrate 100 with a material having a greater coefficient of absorption than the uncoated top surface of the first substrate 100 prior to placing the assembly in the furnace 900. An absorption enhancing layer 101 formed on the top surface of the first substrate 100 causes the temperature of the first substrate 100 and the array of solder balls 300 to rise more rapidly, and to maintain a greater temperature differential between the first substrate 100 and the second substrate 200 during the reflow process.

Figure 10:
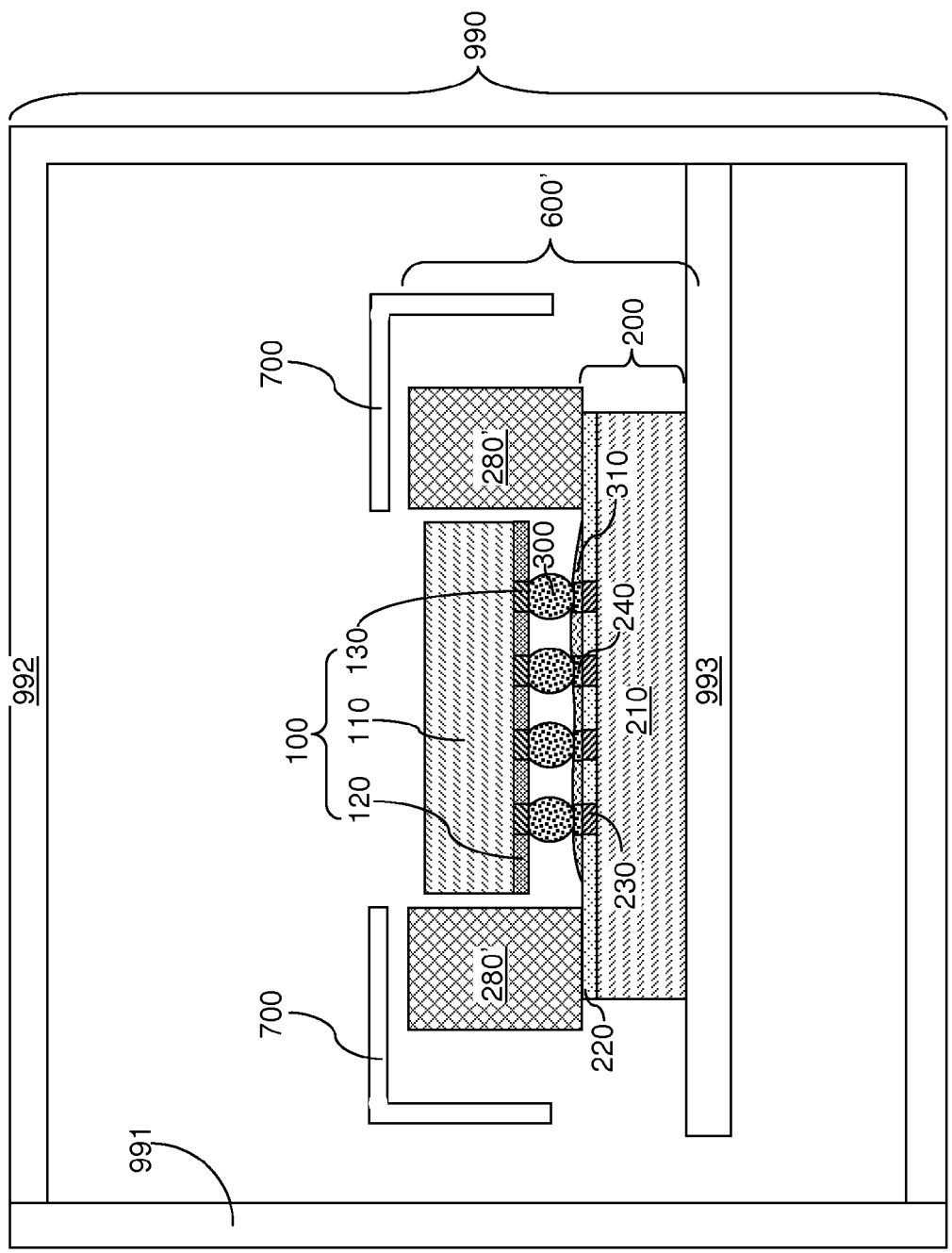
FIG. 10 is a vertical cross-sectional view of a ninth exemplary structure after loading of an assembly of a first substrate, a second substrate, an array of solder balls, and a thermal-mass-increasing fixture into a furnace according to a ninth embodiment of the present disclosure.

Referring to FIG. 10, a ninth exemplary process according to a ninth embodiment of the present disclosure employs the same processing steps as the first, second, third, fourth, fifth, sixth, seventh, or eighth embodiments and a ninth exemplary structure, which is derived from the sixth, seventh, or eighth exemplary structure by providing a heat shield 700, which retards heating of the second substrate 200 and the thermal-mass-increasing fixture 280' during temperature ramp-up of the assembly 600, and retards cooling of the second substrate 200 and the thermal-mass-increasing fixture 280' during cool-down of the assembly 600. The heat shield 700 of the ninth embodiment can have the same composition and structure as the heat shield of the fifth embodiment. Thus, the heat shield 700 located above a periphery of the second substrate 200 and laterally surrounding the firsts substrate 100 causes the temperature of the first substrate 100 and the array of solder balls 300 to rise more rapidly, and to maintain a greater temperature differential between the first substrate 100 and the second substrate 200 during the reflow process. Further, the heat shield is present around the periphery of the second substrate 200 during the cooling of the assembly 600, thereby retarding the cool-down of peripheral solder balls 300 and reducing the temperature gradient within the array of solder balls 300 during the cool-down of the assembly 600.

EXAMPLES

Figure 11:
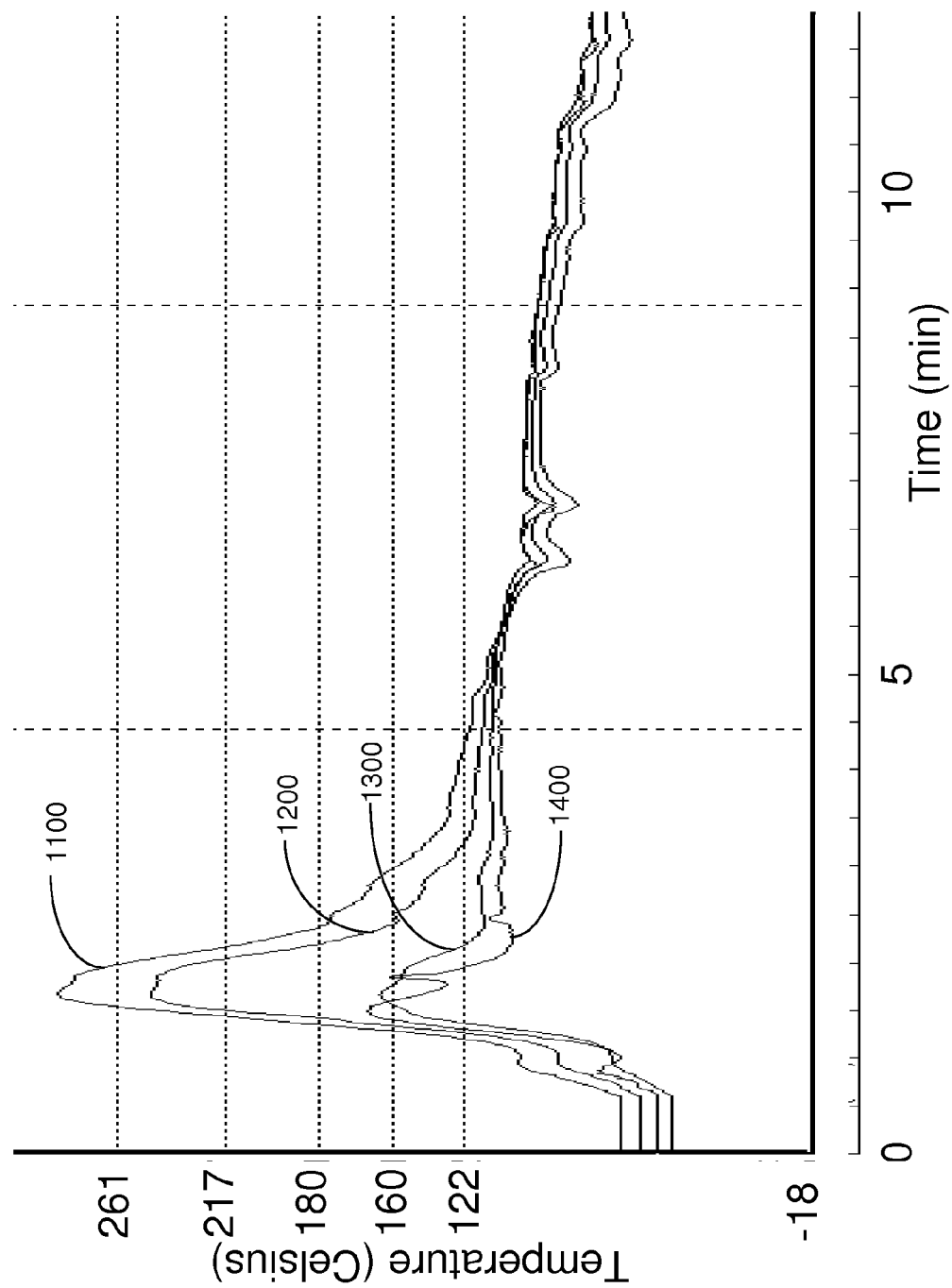
FIG. 11 is a first exemplary graph of measured temperature at various portions of an assembly as a function of time in a first illustrative example.

Referring to FIG. 11, a first exemplary graph shows measured temperature at various portions of an exemplary assembly 600 of a first substrate 100, a second substrate 200, and an array of solder balls 300 as a function of time. The exemplary assembly 600 had the configuration of the first embodiment of the present disclosure, the thermal-mass-increasing fixture 280 was composed of a ceramic material, and the furnace was an infrared furnace. Curve 1100 represents the temperature at the top of the first substrate 100. Curve 1200 represents the temperature at a peripheral solder ball within the array of solder balls 300. Curve 1300 represents the temperature at the top of the second substrate 200. Curve 1400 represents the temperature at the bottom of the second substrate 200.

Figure 12:
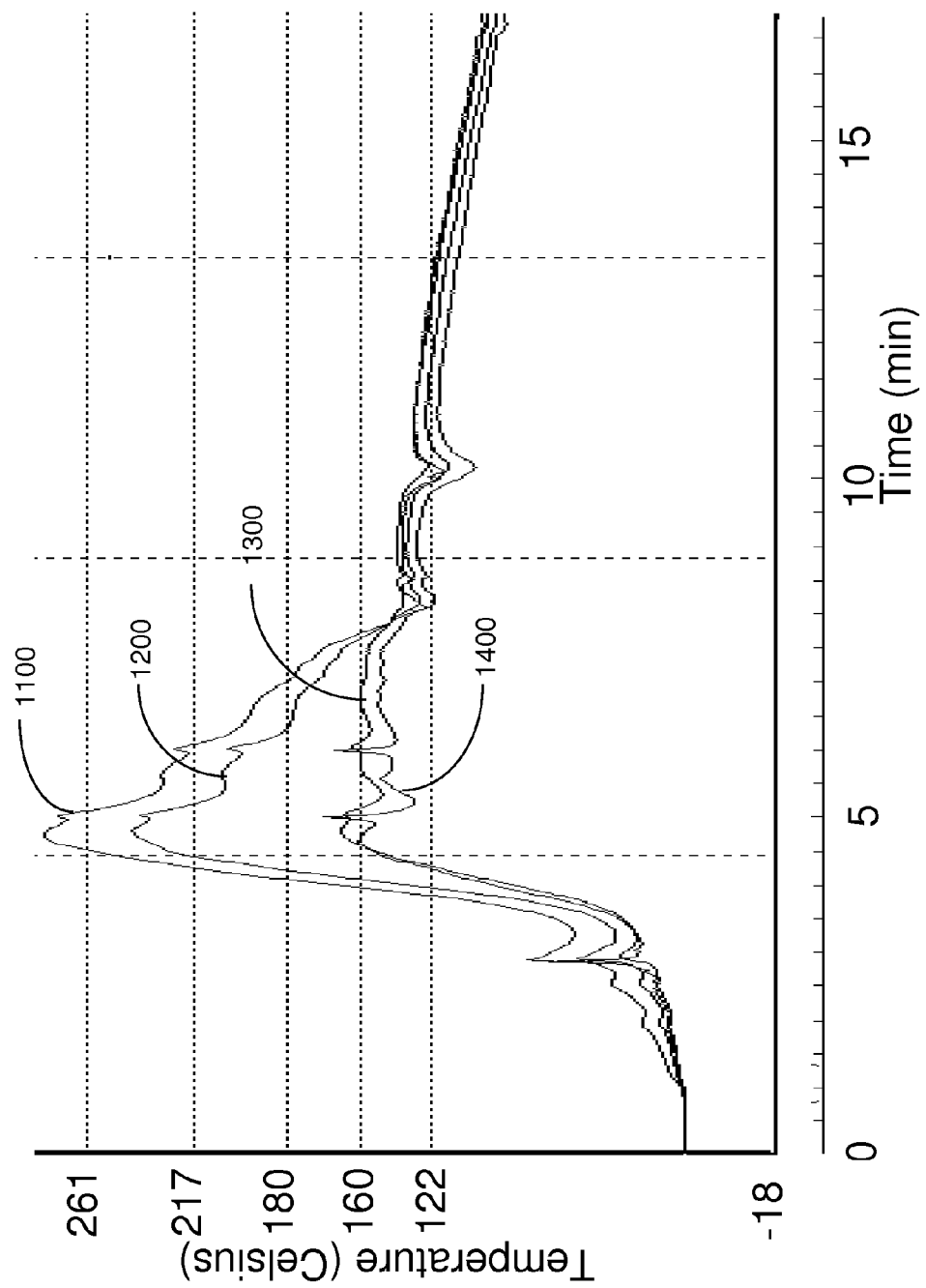
FIG. 12 is a second exemplary graph of measured temperature at various portions of an assembly as a function of time in a second illustrative example.

Referring to FIG. 12, a second exemplary graph shows measured temperature at various portions of an exemplary assembly 600 of a first substrate 100, a second substrate 200, and an array of solder balls 300 as a function of time. The exemplary assembly 600 had the configuration of the first embodiment of the present disclosure, the thermal-mass-increasing fixture 280 was composed of a ceramic material, and the furnace was a convection furnace. Curve 1100 represents the temperature at the top of the first substrate 100. Curve 1200 represents the temperature at a peripheral solder ball within the array of solder balls 300. Curve 1300 represents the temperature at the top of the second substrate 200. Curve 1400 represents the temperature at the bottom of the second substrate 200.

In the first and second exemplary graphs, the time period for reflow process was about 1 minute. The temperature of the array of solder balls 300 was greater than the temperature of the second substrate 200 by at least 50 degrees Celsius during the reflow process. The temperature differential between the top surface of the first substrate 100 and the array of solder balls 300 was less than the temperature differential between the array of solder balls 300 and the second substrate 200 during the reflow process.

In the first and second exemplary graphs, the presence of the thermal-mass-increasing fixture 280 in the assembly 600 reduced the cool-down rate of the measured peripheral solder ball 300 located at a periphery of the array of the solder balls 300 relative to an experiment that did not employ the thermal-mass-increasing fixture 280.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

The invention claimed is:

1. A method of bonding substrates comprising:
   bonding an array of solder balls to one of a first substrate and a second substrate;
   forming an assembly of said first substrate, said second substrate, said array of solder balls, and a thermal-mass-increasing fixture, wherein said thermal-mass-increasing fixture is in contact with at least a peripheral surface of said second substrate;
   wherein said second substrate has a top surface and a bottom surface, wherein said top surface is more proximal to said first substrate than said bottom surface, and said thermal-mass-increasing fixture is in contact with a peripheral portion of said top surface;
   placing said assembly in a furnace, wherein said first substrate and said array of solder balls are heated to a higher temperature than said second substrate and said thermal-mass-increasing fixture;
   cooling said assembly while said thermal-mass-increasing fixture is in contact with said peripheral surface of said second substrate, wherein presence of said thermal-mass-increasing fixture in said assembly reduces a cool-down rate of a subset of said solder balls that is located at a periphery of said array; and
   separating a bonded structure including said first substrate, said second substrate, and said array of solder balls from said thermal-mass-increasing fixture after cooling of said assembly.

2. The method of claim 1, wherein said thermal-mass-increasing fixture laterally surrounds said first substrate.

3. The method of claim 1, wherein said thermal-mass-increasing fixture has a hole having an area that is greater than an area of said first substrate.

4. The method of claim 1, wherein said thermal-mass-increasing fixture has a specific heat capacity that is greater than a specific heat capacity of said second substrate.

5. The method of claim 4, wherein said thermal-mass-increasing fixture comprises a material selected from a ceramic material, an elemental metal, an alloy of at least two metals, asphalt, gypsum, mica, and concrete.

6. The method of claim 1, wherein said thermal-mass-increasing fixture has a heat capacity that is greater than a heat capacity of said second substrate.

7. The method of claim 6, wherein said thermal-mass-increasing fixture has a heat capacity that is at least twice said heat capacity of said second substrate.

8. The method of claim 1, further comprising coating a top surface of said first substrate with a material having a greater coefficient of absorption than said top surface of said first substrate prior to placing said assembly in said furnace.

9. The method of claim 1, wherein a heat shield is present around a periphery of said second substrate during said cooling of said assembly.

10. The method of claim 1, wherein said first substrate and said array of solder balls are heated above a melting temperature of said solder balls in said furnace.

11. The method of claim 10, wherein said second substrate and said thermal-mass-increasing fixture are maintained below said melting temperature in said furnace.

12. The method of claim 1, wherein said array of solder balls reflows within said furnace, and a temperature of said array of solder balls is greater than a temperature of said second substrate by at least 20 degrees Celsius during said reflow of said array of solder balls in said furnace.

13. The method of claim 11, wherein said temperature of said array of solder balls is greater than a temperature of said second substrate by at least 50 degrees Celsius during said reflow of said array of solder balls in said furnace.

14. The method of claim 1, wherein a temperature differential between a top surface of said first substrate and said array of solder balls is less than a temperature differential between said array of solder balls and said second substrate while said array of solder balls reflows within said furnace.

15. The method of claim 1, wherein said solder balls are C4 balls.

16. The method of claim 15, wherein said solder balls are lead-free and comprise tin and silver.

17. The method of claim 1, wherein said first substrate is a semiconductor chip and said second substrate is a packaging substrate.

18. The method of claim 17, wherein said second substrate is selected from a ceramic substrate, an organic laminated substrate, a silicone substrate, a metal substrate, and a flexible film substrate.

* * * * *